United States Patent

Lima et al.

[11] Patent Number: 5,949,247
[45] Date of Patent: Sep. 7, 1999

[54] METHOD AND APPARATUS FOR AUTOMATICALLY TESTING AND EVALUATING ELECTRIC GENERATOR SETS

[75] Inventors: Tedd Andrew Lima, Cheshire; Garry Lynn Higgs, Stratford, both of Conn.; Philip Barber, Windham, N.H.; John Churchill, Hollis, N.H.; Kevin Dalphonse, Merrimack, N.H.

[73] Assignee: Fremont/Dynamics Coporation of America, Bridgeport, Conn.

[21] Appl. No.: 08/652,126

[22] Filed: May 23, 1996

[51] Int. Cl.$^6$ .................................................. G01R 31/34
[52] U.S. Cl. ............................................. 324/772; 322/99
[58] Field of Search .............................. 324/772; 322/99; 73/116; 318/490

[56] References Cited

U.S. PATENT DOCUMENTS

| | | | |
|---|---|---|---|
| 3,553,581 | 1/1971 | Tsergas et al. | 324/772 |
| 3,758,857 | 9/1973 | Simpson et al. | 324/772 |
| 3,999,127 | 12/1976 | Siegl | 324/772 |
| 4,042,830 | 8/1977 | Kellenbenz et al. | 324/158.1 X |
| 4,091,662 | 5/1978 | Emanuel | 73/116 |
| 4,658,213 | 4/1987 | Finley | 324/772 |
| 4,682,103 | 7/1987 | DeNardis | 324/772 |
| 5,126,678 | 6/1992 | Williams | 324/545 |
| 5,144,232 | 9/1992 | Veenstra | 324/177 |
| 5,281,908 | 1/1994 | Kondo | 324/772 |

*Primary Examiner*—Glenn W. Brown
*Attorney, Agent, or Firm*—McCormick, Paulding & Huber

[57] ABSTRACT

A generator set testing system includes a generator set having generator set output signals indicative of generator set output characteristics, an automated load bank coupled to the generator set which imposes upon the generator set an electrical load, and an automated testing unit. The automated testing unit comprises a load bank control package for generating load bank control signals to control the electrical load, an output measurement apparatus for receiving the generator set output signals and further for generating processing signals in dependence thereupon, and a controller coupled to the load bank control package and to the output measurement apparatus. The controller receives the processing signals and generates test result signals in dependence on the processing signals and in dependence on prescribed analysis criteria, and further generates the load bank command signals in dependence on prescribed test criteria.

16 Claims, 6 Drawing Sheets

METHOD AND APPARATUS FOR AUTOMATICALLY TESTING AND EVALUATING ELECTRIC GENERATOR SETS

FIELD OF THE INVENTION

The present invention relates to generator set testing and more specifically to generator set testing and analyzing the results of generator set tests.

BACKGROUND OF THE INVENTION

Instruments which test generator sets are known in the art. As is also known in the art, such instruments evaluate generator set performance by analyzing prescribed output signals indicative of generator set output characteristics such as output voltage, frequency, current and power quality while the generator set is under a variety of electrical load conditions. An example of an instrument which tests generator sets is disclosed by U.S. Pat. No. 5,144,232, incorporated herein by reference. Disclosed therein is a device which measures the operating speed and voltage output of a generator set, thereby allowing a user to verify if the generator set operates properly. The device includes an analog AC volt meter and a digital frequency display which respectively provide a visual reading of generator set voltage and frequency. U.S. Pat. No. 5,144,232 is exemplary of known generator set testing systems, which systems comprise instruments for recording prescribed generator set outputs, such as voltmeters, ammeters, oscilloscopes and strip charts. Each such instrument is capable of recording a single prescribed output at a time.

Generator sets which are to be sold to certain military entities must comply with the test procedures set forth in MIL-STD-705C, "Military Standard, generator sets, Engine Driven, Method of Tests and Instructions", incorporated herein by reference. MIL-STD-705C explains, establishes and standardizes specific methods for measurements associated with the evaluation of generator sets. Those who sell generator sets to purchasers who require compliance with MIL-STD-705C are contractually obligated to assure that generator sets conform to MIL-STD-705C requirements. Before the purchaser accepts a batch, or lot, of generator sets, each generator set in the lot is subjected to MIL-STD-705C specified tests. A generator set which fails to meet any of a number of prescribed requirements during any test is considered defective, causing rejection of the entire lot. Furthermore, rejection is grounds for the purchaser to refuse further acceptance of generator sets from the seller until the seller implements purchaser-approved corrective action at the seller's expense.

In light of the above, those who sell generator sets invest significant resources in testing generator sets for compliance with MIL-STD-705C. In conventional generator set testing systems, a technician configures a generator set and test equipment in accordance with the requirements for a test. The test equipment generally includes a device known in the art as a load bank. A load bank imposes a prescribed electrical load upon a generator set to which the load bank is coupled. The characteristics of the load which is imposed upon the generator set is determined in accordance with load bank controls such as toggle switches and mechanical dials which are coupled to the load bank and operated by a technician.

The technician conducts the test on the generator set and records the test results by observing outputs of devices which measure test specific parameters such as generator set voltage, frequency, current and power. To conduct a test and to record test results typically requires forty eight hours. A trained analyst analyzes the recorded test results in accordance with prescribed analysis criteria, thus determining whether the generator set has passed the test. The test results typically require twenty hours to analyze.

A drawback of known generator set testing systems is that it requires several hours to conduct a single test and analyze the test results. It would be advantageous to have a generator set testing system which can automatically conduct tests and quickly analyze test results. It would be especially advantageous to have a generator set testing system which automatically conducts tests in accordance with MIL-STD-705C.

Another drawback of known generator set testing systems lies in the large amount of time spent by the technician and the analyst. The technician must continually record test data as the test is in process, and therefore cannot perform more than a single test at a time. Similarly, an analyst can analyze the results of only a single test at a time, The technician and analyst thereby act as a bottleneck in testing generator sets and analyzing test results. Furthermore, since the analyst can analyze the results of only a single test at a time, the technician must decide whether to await the outcome of the analysis before initiating another test or to immediately initiate another test. If the technician immediately initiates another test, he risks wasting valuable time and resources testing a generator set which the analysis will show to be defective. On the other hand, if the technician awaits the outcome of the analysis before initiating another test, he tests generator sets much more slowly, seriously reducing generator set testing throughput. It would be advantageous to have a system for testing generator sets in which several generator sets are tested simultaneously by a single individual.

Still another drawback of known generator set testing systems is that they depend on highly trained technicians to conduct the tests and to record test results. Similarly, such generator set testing systems require trained analysts to analyze test results. It would be advantageous to have a system for testing generator sets which does not require a highly trained technician nor a highly trained analyst.

Another drawback of known generator set testing systems is that the trained technician who records test results often introduces errors into the recorded test results by rounding a test result to an integer value or even by incorrectly transcribing a test result. It would be advantageous to have a system for testing generator sets which accurately records test results.

Another drawback of known generator set testing systems is that they do not automate the administration of the procedures set forth in MIL-STD-705C. Known generator set testing systems must be tailored to implement the MIL-STD-705C procedures. It would be advantageous to have a system for testing generator sets which automates the procedures set forth in MIL-STD-705C.

A generator set has output, characteristics, such as voltage and frequency, which generally depend on a load imposed upon the generator set. Ideally, the generator set voltage and generator set frequency remain at substantially constant values. Typically, the voltage and frequency do not remain constant, but slightly deviate from a mean voltage value and a mean frequency value, respectively. Minor deviations of the voltage from a mean voltage value, that is, deviations wherein the voltage lies within a desirable voltage range, or band, are deemed to be acceptable voltage values. Similarly, minor deviations of the frequency from a mean frequency value, that is, deviations wherein the frequency lies within a desirable frequency range, or band, are deemed to be acceptable frequency values. Unfortunately, a frequency value or a voltage value of a generator set may continually and periodically fluctuate outside of the desirable range. The periodic fluctuation of a generator set output characteristic outside of a desirable range is known as a "hunting condition", and generally indicates a generator set which does not meet specifications. In known generator set testing systems, a technician or other individual detects a hunting condition by listening to sounds emitted by the generator set. The technician, based on his experience, ascertains whether a hunting condition exists if the sounds emitted are repetitive tones of prescribed frequencies. It would be advantageous to have a system for testing generator sets which automatically detects hunting conditions.

SUMMARY OF THE INVENTION

An object of the present invention is to provide a generator set testing system which conducts a test and analyzes test results in a substantially shorter time than conventional generator set testing systems.

Another object of the present invention is to provide a generator set testing system in which several generator sets are tested simultaneously by a single individual, thereby providing high generator set testing throughput.

Still another object of the present invention is to provide a generator set testing system which does not require a highly skilled technician to conduct tests and record test results, and further does not require a trained analyst to analyze the test results.

Another object of the present invention is to provide a system which accurately records test results.

Another object of the present invention is to provide a system which acquires, stores, analyzes, and reports generator set test results pursuant to satisfying contractually specified tests set forth in MIL-STD-705C, "Military Standard, generator sets, Engine Driven, Method of Tests and Instructions".

Still another object of the present invention is to provide a system which can perform prescribed sets of tests on a first generator set, and simultaneously perform another prescribed set of tests on a second generator set.

Another object of the present invention is to provide a system which automatically detects hunting conditions.

Still another object of the present invention is to provide a system which eliminates the need for expensive and complicated test equipment.

Another object of the present invention is to provide a system which can readily and easily be adapted to perform new tests.

According to the present invention, an apparatus for conducting a test on a generator set in accordance with prescribed test criteria, and further for analyzing results of the test in accordance with prescribed analysis criteria, wherein the generator set has generator set output signals, comprises an automated load bank coupled to the generator set for imposing upon the generator set an electrical load which is dependent upon received load bank control signals, and an automated testing unit comprising a load bank control package for generating the load bank control signals in dependence on load bank command signals, an output measurement apparatus for receiving the generator set output signals and further for generating processing signals in dependence on the generator set output signals, and a controller coupled to the load bank control package and to the output measurement apparatus. The controller receives the processing signals and generates test result signals in dependence on the processing signals and in dependence on the prescribed analysis criteria, and further generates the load bank command signals in dependence on the prescribed test criteria.

According to another aspect of the present invention, the hereinabove described apparatus for conducting a test on a generator set in accordance with prescribed test criteria, and further for analyzing results of the test in accordance with prescribed analysis criteria, includes an output measurement apparatus comprising a signal conditioning box and a data acquisition board. The signal conditioning box is coupled to the generator set and receives the output signals from the generator set, as well as generates measurement signals in dependence on the output signals. The signal conditioning box comprises a plurality of transducers, wherein each transducer receives a prescribed subset of the output signals and generates a prescribed subset of the measurement signals. The data acquisition board is coupled to the signal conditioning box, and receives the measurement signals from the signal conditioning box, as well as generates the processing signals in dependence thereupon.

According to another aspect of the present invention, an apparatus for conducting tests on a plurality of generator sets in accordance with prescribed test criteria, and further for analyzing results of the tests in accordance with prescribed analysis criteria, wherein the generator sets have generator set output signals, comprises a plurality of automated test stations and a file server coupled thereto. The automated test stations are for conducting the tests on the generator sets and for receiving the generator set output signals, and for generating signals indicative of test results in dependence on the generator set output signals and in dependence on signals indicative of the prescribed analysis criteria. The file server is coupled to the automated test stations, and provides signals indicative of the prescribed test criteria and signals indicative of the prescribed analysis criteria to the automated test stations, and further receives from the automated test stations the test result signals and stores the test result signals.

DESCRIPTION OF PREFERRED EMBODIMENT

The present invention performs the functions previously allocated to various individuals by determining tests to perform, performing the tests and analyzing test results. The present invention permits a nominally trained test technician to test a plurality of generator sets simultaneously. The technician who operates the generator set testing system requires only basic computer skills which allow him to follow computer displayed instructions. Furthermore, a trained analyst is not required to analyze test results, since the present invention performs the analysis without the need for human intervention.

Figure 1:
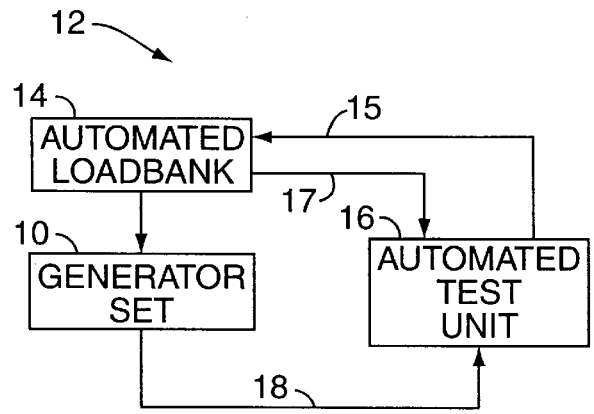
FIG. 1 is a schematic illustration of a generator set testing system provided in accordance with the present invention.

Referring now to FIG. 1, there is shown in simplified schematic form an automated test station 12. The automated test station 12 comprises a generator set 10, an automated load bank 14 and an automated test unit 16. Each of the components 10, 14 and 16 of the automated test station 12 is coupled to the other, as shown by FIG. 1. In the preferred embodiment, the automated test station 12 provided in accordance with the present invention is not limited to a specific type of generator set, but instead is suitable for testing generator sets of a variety of sizes and speeds which are enumerated hereinafter. Adaptation of the present invention to generator sets of sizes and speeds different than those enumerated hereinafter requires those skilled in the art to make minimal modifications to the design presented herein, and does not depart from the scope of the present invention.

The automated load bank 14 imposes on the generatorset 10 an electrical load. As is known in the art, the load bank 14 imposes an electrical load when current from the generatorset 10 passes through the load bank 14. The characteristics of the imposed load are determined by load bank control signals sent on line 15 from the automated test unit 16 to the automated load bank 14. The load bank control signals configure the automated load bank 14 in accordance with prescribed test methods, and the automated load bank 14 thereby imposes a desired electrical load condition in a manner described hereinafter.

The automated test unit 16 receives from the generatorset 10 output signals on line 18. The output signals are indicative of output characteristics of the generatorset 10 while the generator set is under a load imposed by the automated load bank 14. Typical output signals are indicative of such generator set output characteristics as voltage, current, power and frequency. Thus, the automated test unit 16 performs a variety of tests upon the generatorset 10 by configuring a desired electrical load condition on the generatorset 10 through the automated load bank 14, and receiving the output signals from the generatorset 10 on line 18. As is known in the art, some output characteristics of the generator set are constant, while other output characteristics vary with time. Accordingly, a prescribed subset of the output signals are constant, and another prescribed subset of the output signals are time-varying.

Figure 2:
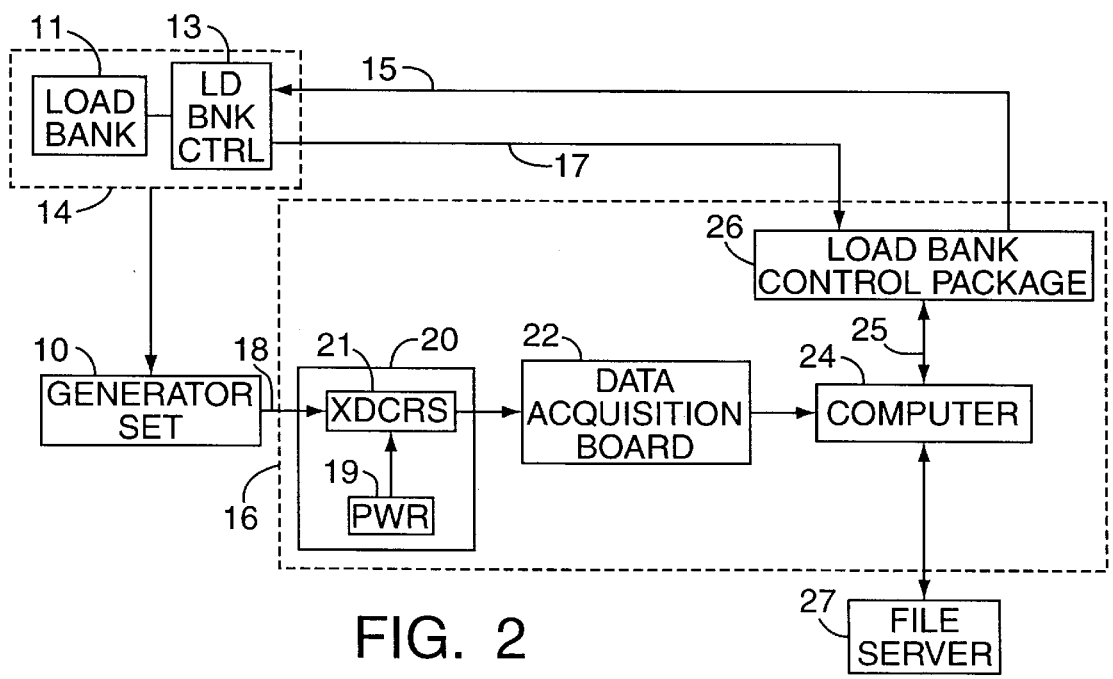
FIG. 2 is a schematic illustration of the generator set testing system of FIG. 1 in greater detail.

FIG. 2 shows the automated test unit 16 of FIG. 1 in greater detail. Unlike conventional generator set testing systems which require dedicated equipment, the embodiment of the automated test unit 16 which is described herein is sufficiently flexible to permit its adaptation to a wide variety of tests with very minor modifications.

In the preferred embodiment, a load bank 11 is a commercially available load bank, such as Model K675A Permanent Resistive and Reactive Load Bank from Avtron Manufacturing, Inc. As described hereinafter, the commercially available load bank is controlled by load bank controls 13, which are modified so that they are responsive to the load bank control signals sent on line 15 from the automated test unit 16. As is known in the art, a load bank comprises motor driven adjustable ratio transformers (not shown), called variable autotransformers, load elements (not shown), such as resistive elements and reactive elements, contactors(not shown) to selectively engage the load elements, and a fan (not shown). Variable autotransformers allow control of the imposed load conditions, and the fan cools the load bank when the load elements heat due to excessive power consumption. The Model K675A load bank is especially suitable for testing 5 Kilowatt and 10 Kilowatt generator sets at 120/208 Volt, 3 phase, 4 wire at 60 or 400 Hz. The Model K675A is also capable of connection and operation at 120 Volt, 1 phase, 2 wire and 120/240 Volt, 1 phase, 3 wire configurations. The Model K675A is rated at 15 kW/25 Kilovars at 120/208 Volt, 3 phase, 4 wire, 60 and 400 Hz.

Multiple commercially available load banks can also be cascaded together to function as a single load bank. For example, the Avtron Manufacturing, Inc. Model K575 provides resistive loading, while the Avtron Model K341 provides reactive loading. Using both the K575 and the K341 simultaneously to load a generator set is preferred for testing 15 Kilowatt, 30 Kilowatt and 60 Kilowatt generator sets at 120/208 Volts and 240/416 Volts, 3 phase, 4 wire at 60 or 400 Hz. Those skilled in the art can substitute other load banks or combinations of load banks to serve as the load bank 11 without departing from the scope of the present invention.

As is known in the art, in conventional generator set testing systems load bank controls which configure a load imposed by the load bank 11 are typically manually operated mechanical devices such as push buttons or toggle switches. Manually operating the mechanical load bank controls, such as pushing a button or toggling a switch, closes or opens an electrical circuit contact, thereby engaging or disengaging different components of the load bank and imposing a load on the generator set 10. To facilitate control of the automated load bank 14 by the automated test unit 16, the load bank controls 13 comprise controls of a commercially available load bank which are modified to accept load bank control signals on line 15. Relays (not shown in FIG. 2) which are coupled to each mechanical load bank control are responsive to the load bank control signals, and close and open in accordance with the load bank control signals sent from the automated test unit 16. As described hereinafter, in the preferred embodiment, the relays coupled to the mechanical load bank controls are normally open AC solenoids. Thus, the automated test unit 12 duplicates conventional operations of the mechanical load bank controls by sending load bank control signals to the load bank control.

A signal conditioning box 20 receives the output signals from the generator set 10 on line 18. The signal conditioning box 20 generates measurement signals in dependence on the received output, signals. The signal conditioning box 20 comprises a power supply 19 and a plurality of transducers 21 powered thereby. Each transducer in the plurality of transducers 21 accepts a subset of the output signals and generates a subset of the measurement signals in dependence thereupon. In the preferred embodiment, the measurement signals generated by the plurality of transducers 21 are analog voltage signals between 0 Volts and 10 Volts. In another embodiment, the measurement signals generated by the set of transducers 21 are analog voltage signals between −5 Volts and 5 Volts. In still another embodiment, some of the measurement signals are analog voltage signals between −5 Volts and 5 Volts, and the remaining measurement signals are analog voltage signals between 0 Volts and 10 Volts.

Also in the preferred embodiment, the following types of transducers, known to those skilled in the art, are provided in the signal conditioning box to permit measurements prescribed by MIL-STD-705C: High Speed Current Transducer, High Speed Voltage Transducer, RMS Current Transducer, RMS Voltage Transducer, Power Transducer, Pressure Transducer, Thermocouple Transducer, Multi-tap Current Transformer and Frequency Transducer. As discussed hereinafter, the signal conditioning boxes of other automated test units may comprise different types of transducers. Table 1 enumerates transducers used in the preferred embodiment, as well as their Ohio Semitronics, Inc. respective part numbers.

TABLE 1

Part Numbers of Preferred Transducers

| | |
|---|---|
| FTA-4567 | 0–500 Hz Frequency Transducer |
| CT7-015D | 0–10 Amps Current Transducer |
| PC20-002DX1337 | Volt/Watt/Amp Transducer |
| VTR-001DX1358 | 0–150 V Transducer True RMS |
| VTR-002DX1358 | 0–300 V Transducer True RMS |
| VT7-009D | 0–500 V Transducer DC to 10 kHz |
| 2000G-1G5-A | 135 PSI, Pressure Transducer |
| CT7-017DX1047 | 0–20 Amps Current Transducer |
| VT7-003DX1047 | 0–50 V Transducer DC to 10 kHz |
| VT7-005D | 0–150 V, DC to 10 kHz, Generator set Field Voltage |
| CT7-015DX1047 | 0–10 Amps Current Transducer |

A data acquisition board 22, preferably a 7875 PC Multifunction Board by Virtech, Inc., receives the measurement signals from the signal conditioning box 20 and generates processing signals in dependence thereon. The signal conditioning box 20 and the data acquisition board 22 together comprise an output measurement apparatus which receives the output signals from the generatorset 10 and generates processing signals in dependence thereupon. Whereas the measurement signals are analog signals, the processing signals are digital signals, preferably twelve-bit digital signals, which are indicative of the measurement signals. The processing signals can comprise any number of bits, and it is known in the art that a greater number of bits provides greater resolution of the measurement signals. For example, twelve-bit digital signals provide a resolution of $2^{12}$, or 4,096 different values.

The data acquisition board 22 periodically samples the measurement signals as described hereinafter. As is known in the art, sampling a signal consists of determining and storing the value of the signal at prescribed instants which are fixed time intervals apart, for example, every millisecond or every sixteen microseconds. As is also known in the art, the rate at which sampling occurs must be at least twice as fast as the highest frequency component in the time-varying signal. For example, if the time-varying signal has a maximum frequency of 100 Hz, then the sampling rate must be 200 Hz or faster to avoid sampling errors. In the preferred embodiment, the sampling rate is at least 25% higher than twice the highest frequency component in the measurement signals.

The data acquisition board 22 samples at one of a number of possible sampling rates, depending on the test to perform and expected characteristics of the measurement signals which are known to those skilled in the art of generator set testing. For example, during method 608.1b, "Frequency and Voltage Regulation, Stability and Transient Response Test (Short-Term)" of MIL-STD-705C, the sampling rate is 100 Hz, or one hundred samples per second, in the preferred embodiment. For other tests, such as method 655.1a, in which MIL-STD-705C specifies that test results are to be displayed on an oscilloscope and photographed, the sampling rate in the preferred embodiment is 40 kHz, or 40,000 samples per second.

The data acquisition board 22 preferably has a dedicated microprocessor, thereby allowing the board 22 to accurately sample the measurement signals at a desired sampling rate without interruption. If the board 22 does not have a microprocessor which is dedicated to sampling the measurement signals, the board 22 may not be able to sample at each of the prescribed instants and will miss samples of the measurement signals.

The data acquisition board 22 comprises a plurality of channels (not shown). A channel receives a subset of the measurement signals from a transducer in the plurality of transducers 21 at a channel input terminal and generates a subset of the processing signals in dependence thereupon at a channel output terminal. In the preferred embodiment, the data acquisition board 22 comprises thirty-two channels. Six of the thirty-two channels receive measurement signals from thermocouples, and one channel each of the thirty-two channels receives measurement signals indicative of generator set field voltage, generator set field amperage, left exhaust pressure, right exhaust pressure, intake manifold pressure and oil pressure. Nineteen channels of the thirty-two channels accept signals indicative of AC outputs, such as AC current and AC voltage.

However, those skilled in the art will recognize that the specific allocation of data acquisition board 22 channels to signal conditioning box transducers depends on the outputs to receive in accordance with prescribed test criteria, and can be different than the allocations described herein. For example, a test station can use twenty four channels to receive signals from thermocouples, rather than only six channels as disclosed hereinabove.

The use of data acquisition board channels to receive measurement signals and to generate processing signals in dependence thereupon is substantially advantageous over conventional generator set testing systems. Each channel of a data acquisition board receives measurement signals independently of each other channel. Similarly, each channel of a data acquisition board generates processing signals independently of each other channel. Thus, the data acquisition board can generate multiple processing signals simultaneously. For example, the data acquisition board can simultaneously receive measurement signals indicative of generator set voltage, power, current and frequency, and can further simultaneously generate processing signals indicative of generator set voltage, power, current and frequency. By contrast, in conventional generator set testing systems an individual can only record one type of output signal from a generator set at a time. Thus, the system provided in accordance with the present invention significantly reduces the amount of time required to record test results.

The data acquisition board 22 is coupled to a computer 24 which receives the processing signals therefrom. The computer 24 receives and stores the processing signals for further analysis and display, as described hereinafter. The computer 24 is typically based on a type 80486DX microprocessor, and has such computer hardware and software as is necessary to perform the functions described herein, such as a monitor, a disk drive, memory, a keyboard, communications ports and a mouse. As described hereinafter, testing software (not shown) which runs on the computer 24 includes routines for test method implementation, load bank control, test result acquisition, test result storage, test result analysis and report generation, allowing the computer 24 to act as a controller for the automated testing unit 12. Those skilled in the art will note that another advantage of the present invention is that the computer 24 can operate while the data acquisition board 22 continues to receive measurement signals and to generate processing signals. Computer technology permits the processing signals to be temporarily stored in a buffer, such as in a RAM buffer (not shown) on the computer 24 or in a RAM cache (not shown) on the data acquisition board 22.

The computer 24 also generates load bank command signals which are presented to a load bank control package 26 along a four conductor serial communication line 25, such as an RS485 serial line. The load bank control package 26 serves as the interface between the computer 24, which generates digital signals, and the automated load bank 14. Accordingly, the load bank control package 26 generates load bank control signals in dependence on the received load bank command signals, and the load bank control signals configure the automated load bank 14 to impose a desired electrical load on the generator set 10, as described hereinabove. The load bank control package 26 controls the following operations of the automated load bank 14 which are known in the art: turn main power on and off, start and stop the fan, turn a "master load" on and off, turn the master load on and off for each phase and apply individual resistive and reactive load elements in "load steps".

The load bank control package 26 further receives from the automated load bank 14 on line 17 load bank output signals which are indicative of the operational state of the load bank 14. Load bank output signals include a main power on signal, a fan on signal, a fan failure signal and an overtemperature signal. The load bank control package 26 generates load bank processing signals in dependence on the load bank output signals. The load bank processing signals are sent along the four conductor serial line 25 to the computer 24 for interpretation and processing by testing software as described hereinafter.

Figure 7:
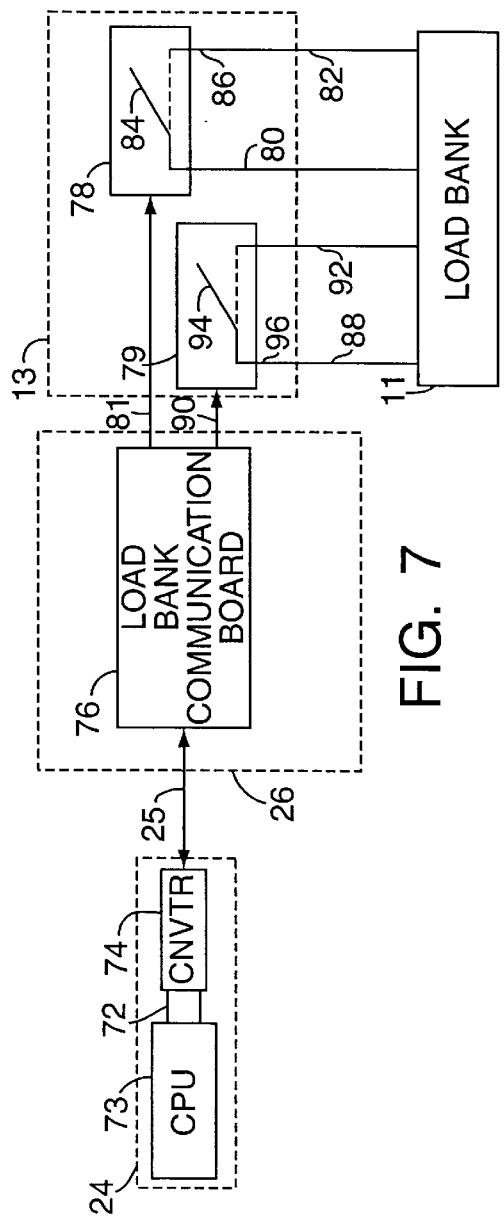
FIG. 7 is a schematic illustration of a load bank control package of FIG. 2.

The load bank control package 26 is depicted in greater detail by the schematic illustration of FIG. 7. The computer 24 directs the load bank control package 26 by sending load bank command signals on line 25. In the preferred embodiment, the load bank command signals are sent from a serial port 72 coupled to a central processing unit 73 (CPU) of the computer 24, such as an RS232 serial port. Also in the preferred embodiment, the computer 24 further comprises a converter 74, such as a Virtech 4225 RS232 to RS485 converter card, which converts the load bank command signals from a transmission protocol of the serial port 72 to a transmission protocol of the line 25. For example, if the line 25 is an RS485 serial line and the serial port 72 is an RS232 serial port, then the converter 74 converts the load bank command signals from RS232 protocol to RS485 protocol. By using a converter to convert the transmission protocol of load bank command signals sent from the computer 24 to the transmission protocol of the load bank control package 26, the choice of the transmission protocols used by the computer 24 and those used by the load bank control package 26 need not be the same. Accordingly, the choice of computer is not limited to a computer with a particular type of serial port. Similarly, the choice of load bank control package is not limited to a load bank control package having a particular type of transmission protocol.

The use of a serial line 25 is advantageous in that the computer 24 may be a substantial distance from the load bank control package 26, but the strength of load bank command signals sent on serial line 25 does not substantially degrade.

A load bank communication board 76 receives the load bank command signals on line 25. The load bank communication board 76 is a microprocessor controlled digital I/O board, such as a B1 Brain Board by OPTO-22, Inc., which controls a plurality of relays 78 and 79 in accordance with the received load bank command signals. The relay 78 receives load bank control signals from the load bank communication board 76 on output line 81. The relay 78 is further connected to a load bank control switch circuit 86 which comprises two terminals 80 and 82 and a switch 84 which opens and closes in accordance with load bank control signals received on output line 81. Thus, the relay 78 functions in a manner analogous to a mechanical load bank control. The relay 79 is connected to a load bank control switch circuit 96 which comprises two terminals 88 and 92 and a switch 94 which opens and closes in accordance with load bank control signals received on line 90. A plurality of output lines 81 and 90 from the load bank communication board 76 to the relays 78 and 79 comprise the line 15 upon which the load bank control signals are received by the automated load bank.

For example, when load bank command signals on line 25 are indicative of a command to close switch 84, the load bank communication board 76 generates load bank control signals on output line 81 which are indicative of a command to close the relay 78. The load bank control signals are received by the relay 78 on output line 81, causing the switch 84 to close (shown in dashed lines), thus electrically coupling terminal 80 to terminal 82, preferably as a zero-impedance short circuit electrical coupling. When load bank command signals on line 25 are indicative of a command to open switch 84, the load bank communication board 76 generates load bank control signals on output line 81 which are indicative of a command to open the relay 78. The open command is received by the relay 78 on output line 81, causing the switch 84 to open, thus electrically isolating terminal 80 from terminal 82, preferably as an open circuit electrical isolation. The relay 79 imposes short circuit and open circuit conditions on the terminals 88 and 92 in a manner which is substantially analogous to the manner in which the relay 78 imposes short circuit and open circuit conditions on the terminals 80 and 82, thus controlling the load bank control switch circuit 96. Thus, the load bank communication board 76 opens and closes a plurality of relays, and therefore a plurality of load bank control switch circuits, in accordance with received load bank command signals.

As is known in the art, the illustrations of the relays 78 and 79 which are shown in FIG. 7 are merely schematic illustrations of components which open and close an electrical circuit. The switches 84 and 94 need not be actual lever-type switches as depicted in FIG. 7, but are in the preferred embodiment solid state relays. Furthermore, though for clarity two relays 78 and 79 are depicted in FIG. 7, those skilled in the art will note that there can be a greater or lesser number of relays which are controlled by the load bank communication board 76, depending on the number of load bank control switch circuits to be controlled by the load bank control package 26. In the preferred embodiment, the load bank control package 76 comprises four 16-channel digital I/O boards, thus allowing the load bank control package 76 to control sixty-four load bank control switch circuits through sixty-four output channels.

The load bank control package 26 is contained in a sealed enclosure (not shown) which is mounted either inside the automated load bank 14 or adjacent to the automated load bank 14. The hereinabove described coupling between the load bank control package 26 and the automated load bank 14, as opposed to a more intuitive direct wiring coupling from the computer 24 to the automated load bank 14, provides full electrical isolation of the computer 24 and the automated load bank 14. Therefore, wiring among components of the automated test station 12 is simplified, making the automated test station 12 more reliable, less expensive and easier to modify. A future increase in the number of load bank control switch circuits does not require a modification to the wiring between the computer 24 and the load bank control package 26. Furthermore, if the load bank control package 26 is mounted in or on the automated load bank 14, removal of the automated load bank 14 during a maintenance shutdown is easier than if the automated load bank 14 were directly connected to the computer 24.

In the preferred embodiment, the computer 24 is also linked to a file server 27 (FIG. 2) The computer 24 sends to the file server 27 signals indicative of test results. As described hereinafter, the file server 27 provides the automated test unit 16 with a central distribution point for testing parameters, as well as a location for data storage and printing functions.

Figure 3:
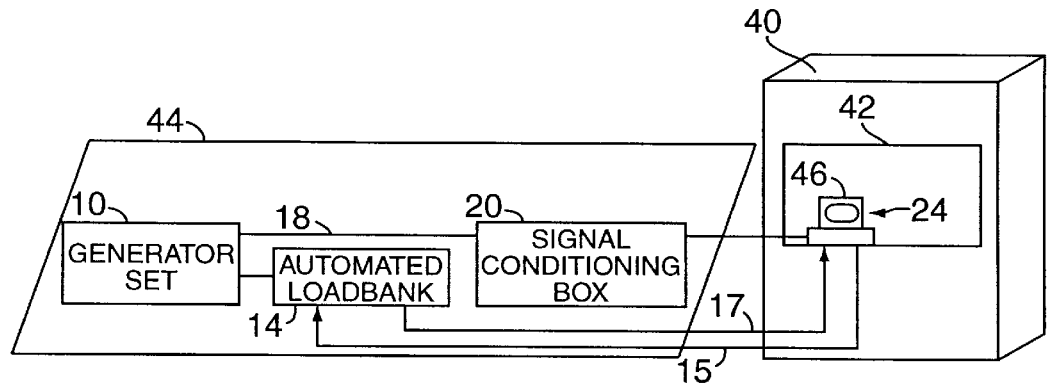
FIG. 3 is a schematic illustration of the generator set testing system of FIG. 1 shown in a testing facility.

FIG. 3 illustrates an automated test station 12 as it would typically exist in a testing facility. The computer 24 is located in an office cubicle 40 adjacent to an area known as a generator set test stand 44. A seventeen inch desktop computer monitor 46 is viewable from either within the office cubicle 40 or from the test stand 44 through a window 42. The computer 24 is operable from within the cubicle 40 using a keyboard (not shown) or from the test stand 44 using a pointing device (not shown) such as a mouse, touch pad, trackball or joystick. A hand-held terminal with a two line display and small keypad is another interface which permits operation of the computer 24 from the test stand 44.

Figure 4:
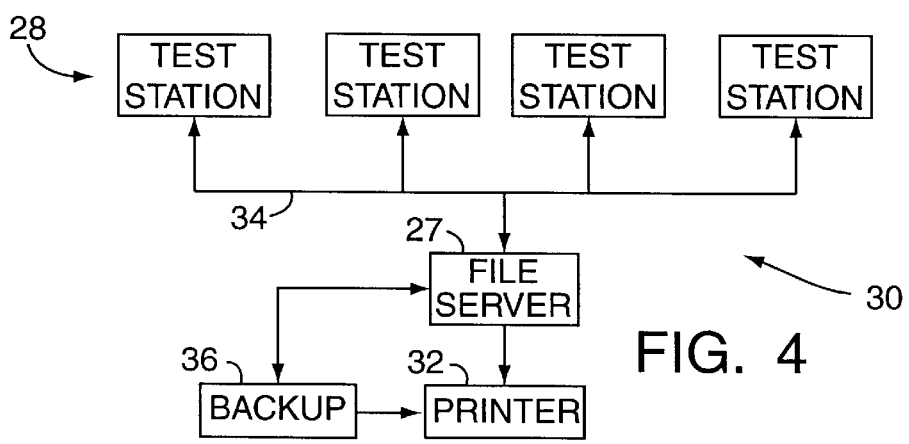
FIG. 4 is a schematic illustration of a network of testing stations.

FIG. 4 shows a simplified schematic illustration of a network 30 of test stations 28. Using a network of test stations to test generator sets provides substantial benefits over using a single test station. With a network of test stations, a single technician can initiate a test at one station and while another previously initiated test is running. Thus, multiple generator sets are simultaneously tested by a single individual, providing significant savings in labor expenses and total time to conduct tests.

Each of the test stations 28 is connected via a network linkage 34 to a file server 27. Test result signals indicative of the results of performed tests are sent from the test stations 28 to the file server 27 for storage and presentation. The file server 27 is connected to a printer 32 and a tape backup storage unit 36. The tape backup storage unit 36 is typically a SCSI DAT tape drive with a four gigabyte capacity. The file server 27 sends signals indicative of test results to be stored to the tape backup storage unit 36 for storage. Test result signals are retained on the test stations 28 until the file server 27 has successfully received the test result signals and stored the test result signals onto the tape backup storage unit 36. The file server 27 further sends signals indicative text and images to be printed, such as test results, to the printer 32 for printing.

In the preferred embodiment, at least a subset of the test stations 28 are mobile, while the remaining test stations are stationary. A portion of the network linkage 34 which connects stationary test stations to the file server 27 is a conventional wired network such as an Ethernet network. That portion of the network linkage 34 which connects mobile test stations to the file server 27 is a remote connection medium, such as a modem and telephone connection or a wireless radio wave transmitter-receiver connection.

The file server 27 is typically based on a 80486DX2/66 microprocessor with sixteen megabytes of RAM and a one-gigabyte hard drive. The file server 27 runs Microsoft NT Advanced Server software, and further includes other such conventional computer hardware and software as is necessary to perform the functions described herein, such as a monitor, a disk drive, memory, a keyboard, communications ports and a mouse.

Stored upon the file server 27 is testing software (not shown) to be used by the test stations 28. The file server 27 sends a copy of the testing software via the network linkage 34 to the test stations 28, allowing each of the test stations 28 to run the testing software. Once each of the test stations 28 has its own copy of the testing software, each of the test stations 28 can complete a test in progress even if the network linkage 34 or the file server 27 fails.

The file server 27 further assures that each of the test station 28 has the latest version of the testing software. The testing software has an associated version number indicative of the release version of the testing software. At the start of a test, a test station receives from the file server 27 signals indicative of the version number of the testing software which is resident upon the file server 27. The testing station compares the version number of the testing software resident on the test station to the version number of the testing software resident on the file server 27. If the two version numbers are not the same, the file server 27 copies the testing software resident thereupon to the test station. In this manner, the generator set testing system provided in accordance with the present invention automatically distributes new testing software features, software revisions and software corrections from a centralized location. Furthermore, since at least a portion of the network linkage 34 is a remote connection medium, such as a modem and telephone connection, software can be distributed and testing stations can be diagnosed from essentially any remote location.

Figure 5:
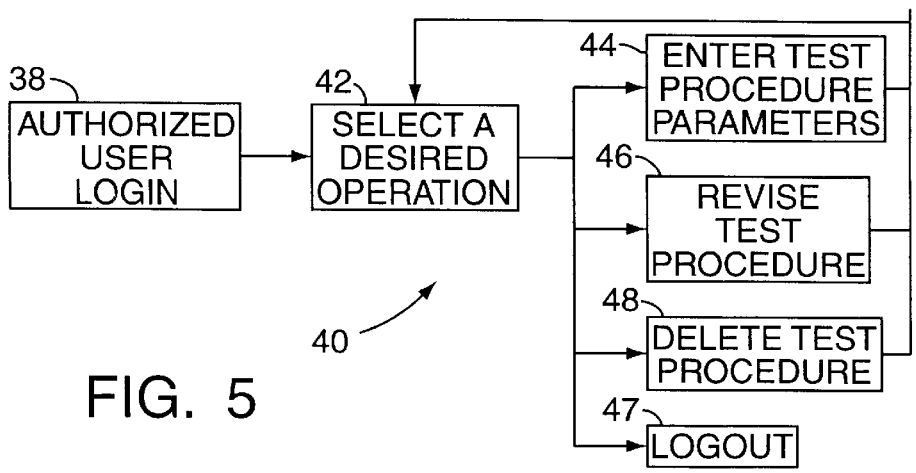
FIG. 5 is a flow chart which illustrates a process by which file server software directs the operations of a file server.

File server control software (not shown) is software which directs the actions of the file server 27. File server control software is run only by the file server 27 and not by the test stations 28. FIG. 5 illustrates a process 40 performed by file server control software resident on the file server 27. As shown by step 38, an authorized user must log in to access the file server 27 by providing a unique identifier, such as a password or identification number. Once the user logs in, the user selects a desired operation from a list of permitted operations, as shown by step 42. The user can choose to enter test parameters of a new test, as shown by step 44, by an on-line software form displayed on a monitor (not shown) of the file server 27. Once the test parameters of a new test have been entered by an authorized user, the new test is available to all test stations 28 on the network 30. The file server control software further controls revision and deletion of testing procedures from the file server 27, shown by steps 46 and 48 respectively. This permits the file server 27 to maintain centralized control of testing procedures. The authorized user logs out after completing desired operations, as shown by step 47.

The operations described hereinabove which are permitted by the filer server control software are presented by way of example, and not of limitation. Those skilled in the art will be able to add other operations to the hereinabove described operations permitted by the filer server control software without departing from the scope of the present invention.

In the preferred embodiment, there are six types of test stations. Each type of test station is optimized to perform a prescribed set of tests on a generator set. Tests which require a similar subset of output signals from a generator set are performed on the same type of test station. For a given type of test station, tests which are performed on a generator set determine the particular subset of the output signals that must be received by the signal conditioning box, and therefore, the particular transducers required in the signal conditioning box. For example, if a first test requires several simultaneous temperature readings, the test station at which the first test is performed includes a signal conditioning box which comprises several thermocouples. If a second test requires several simultaneous voltage readings, the test station at which the second test is performed includes a signal conditioning box which comprises several voltage transducers. Accordingly, the transducers which are included in the signal conditioning box of a test station determine the type of the test station. Those skilled in the art will note that though one type of test is optimally performed at a given type of test station, it may also be performed at another type of test station which comprises the required transducers. Those skilled in the art will further note that though six types of test stations are described herein, they are provided by way of example and not limitation. More than six types of test stations or less than six types of test stations may be used without departing from the scope of the present invention.

In the preferred embodiment, the six types of test stations are ambient test stations, endurance test stations, hot room test stations, parallel test stations, precheck test stations and ruggedized mobile test stations. Table 2 below shows test procedures disclosed by MIL-STD-705C which are performed at each of the six types test stations.

TABLE 2

Test Stations and MIL-STD-705C Tests Conducted Thereupon

Ambient Production Test Station:

| | |
|---|---|
| 503.1c | Start and Stop Test |
| 505.1b | Overspeed Test |
| 505.2b | Overspeed Protection Device Test |
| 507.1d | Phase Sequence Test (Rotation) |
| 508.1d | Phase Balance Test (Voltage) |
| 511.1d | Regulator Range Test |
| 511.2c | Frequency Adjustment Range Test |
| 512.1d | Circuit Interrupter Test (Short Circuit) |
| 512.2d | Circuit Interrupter Test (Overload Current) |
| 512.3d | Circuit Interrupter Test (Overvoltage And Undervoltage) |
| 513.1d | Indicating Instrumentation Test |
| 515.1b | Low Oil Pressure Protective Device Test |
| 515.2b | Over Temperature Protective Device Test |
| 515.5a | Low Fuel Protective Device Test |
| 516.2a | Reverse Power Protective Device Test |
| 516.5a | Reverse Battery Polarity Test |
| 608.1b | Frequency And Voltage Regulation, Stability And Transient Response Test (Short-Term) |
| 620.2b | Voltage Unbalance With Unbalanced Load Test |
| 640.4a | Maximum Power Test For Gasoline And Diesel, generator sets(Production Sets) |
| 655.1a | DC Control Test |

Hot Room Test Station:

| | |
|---|---|
| 710.1d | High Temperature Test |

TABLE 2-continued

Test Stations and MIL-STD-705C Tests Conducted Thereupon

| | |
|---|---|
| 608.1b | Frequency And Voltage Regulation, Stability and Transient Response Test (Long-Term) |
| 619.1d | Voltage Dip For Low Power Factor Loads Test |
| 619.2c | Voltage Dip And Rise For Rated Load Test |

Parallel Test Station:

| | |
|---|---|
| 630.1d | Parallel Operating Test |

Endurance Test Station:

| | |
|---|---|
| 690.1a | Sample Endurance Test |
| 601.1d | Voltage Waveform Test (Oscillographic) |
| 601.4b | Voltage Waveform Test (Harmonic Analysis) |
| 602.1b | Voltage Modulation Test |

Precheck Test Station:

| | |
|---|---|
| 640.2d | Minimum Power Test (Determination Of Requirements For Production Sets) |

Ruggedized Mobile Test Station:

| | |
|---|---|
| 711.1d | Humidity Test |
| 740.4c | Lifting And Towing Test |
| 740.5c | Railroad Impact Test |

Figure 8:
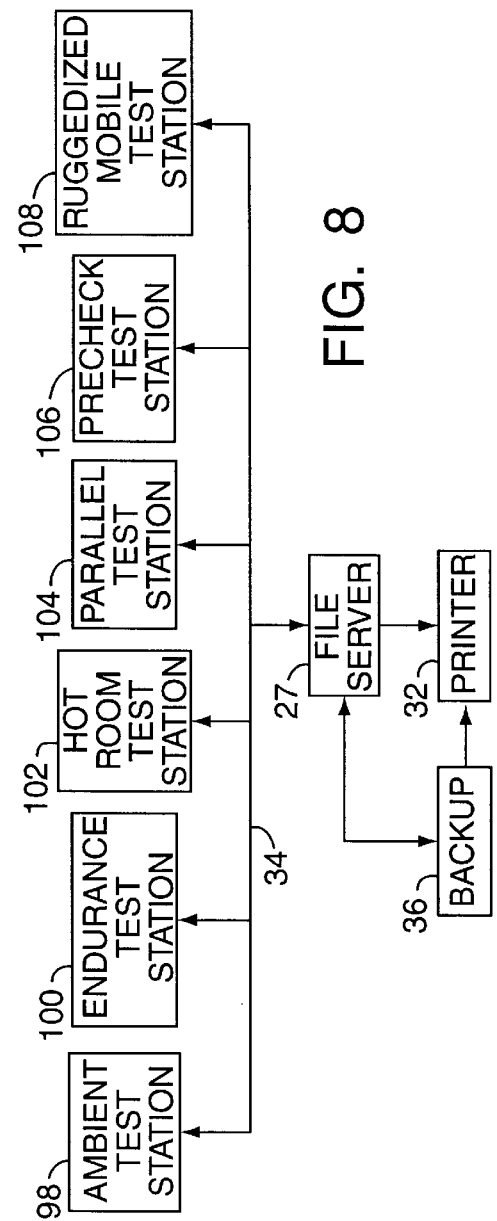
FIG. 8 is a schematic illustration of a network of different types of testing stations.

A generator set testing system provided in accordance with the present invention comprises six test stations, one of each type of test station. FIG. 8 illustrates a generator set testing system comprising an ambient test station 98, an endurance test station 100, a hot room test station 102, a parallel test station 104, a precheck test station 106 and a ruggedized mobile test station 108. The test stations 98, 100, 102, 104, 106 and 108 are coupled through a network linkage 34 to a file server 27, as described hereinabove. Also as described hereinabove, the file server 27 is coupled to a printer 32 and a tape backup storage unit 36.

Tables 3–7 disclose transducers included in the signal conditioning boxes of the types of stations indicated, as well as Ohio Semitronics part numbers for certain transducers. Each of the rows in Tables 3–7 indicate a single transducer in a signal conditioning box, and therefore, a channel of a data acquisition board which receives from the transducer a subset of measurement signals. The transducers disclosed in Tables 3–7 are listed for exemplary purposes, and those skilled in the art will be able to substitute other transducers without departing from the scope of the present invention.

TABLE 3

Ambient Production Test Station Transducers

| | |
|---|---|
| FTA-4567 | 0–500 Hz Frequency Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| VT7-009D | 0–500 Volt Transducer DC to 10 kHz |
| VT7-009D | 0–500 Volt Transducer DC to 10 kHz |
| VT7-009D | 0–500 Volt Transducer DC to 10 kHz |
| VT7-009D | 0–500 Volt Transducer DC to 10 kHz |
| VTR-004DX1358 | 0–600 Volt Transducer True RMS |
| VTR-004DX1358 | 0–600 Volt Transducer True RMS |
| VTR-004DX1358 | 0–600 Volt Transducer True RMS |
| VT7-003DX1047 | 0–50 Volt Trarisducer DC to 10 kHz |
| VT7-005DX1047 | 0–150 Volt Transducer DC to 10 kHz |
| VTR-001DX1358 | 0–150 Volt Transducer True RMS |
| VTR-001DX1358 | 0–150 Volt Transducer True RMS |

TABLE 3-continued

Ambient Production Test Station Transducers

| | |
|---|---|
| VTR-002DX1358 | 0–300 Volt Transducer True RMS, 60 msec |
| CT7-015D | 0–10 Amp Current Transducer |
| CT7-015D | 0–10 Amp Current Transducer |
| CT7-015D | 0–10 Amp Current Transducer |
| CT7-015DX1047 | 0–10 Amp Current Transducer |
| CT7-017DX1047 | 0–20 Amp Current Transducer |
| 2000G-1G5-A | VAC - 135 PSI Pressure Transducer |
| | Thermocouple |
| | Thermocouple |
| | Thermocouple |
| | Thermocouple |

TABLE 4

Hot Room Test Station Transducers

| | |
|---|---|
| FTA-4567 | 0–500 Hz Frequency Transducer |
| PC20-002DX1337 | Volt/Watt/Amp Transducer |
| PC20-002DX1337 | Volt/Watt/Amp Transducer |
| PC20 002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| VT7-009D | 0–500 Volt Transducer DC to 10 kHz |
| VT7-009D | 0–500 Volt Transducer DC to 10 kHz |
| VT7-009D | 0–500 Volt Transducer DC to 10 kHz |
| VT7-009D | 0–500 Volt Transducer DC to 10 kHz |
| VT7-012D | 0–800 Volt Transducer DC to 10 kHz |
| VT7-012D | 0–800 Volt Transducer DC to 10 kHz |
| VT7-012D | 0–800 Volt Transducer DC to 10 kHz |
| VTR-004DX1358 | 0–600 Volt Transducer True RMS |
| VTR-004DX1358 | 0–600 Volt Transducer True RMS |
| VTR-004DX1358 | 0–600 Volt Transducer True RMS |
| VT7-003DX1047 | 0–50 Volt Transducer DC to 10 kHz |
| VT7-00SDX1047 | 0–150 Volt Transducer DC to 10 kHz |
| VTR-001DX1358 | 0–150 Volt Transducer True RMS |
| VTR-001DX1358 | 0–150 Volt Transducer True RMS |
| VTR-002DX1358 | 0–300 Volt Transducer True RMS, 60 msec |
| CT7-015D | 0–10 Amp Current Transducer |
| CT7-015D | 0–10 Amp Current Transducer |
| CT7-015D | 0–10 Amp Current Transducer |
| CT7-015DX1047 | 0–10 Amp Current Transducer |
| CT7-017DX1047 | 0–20 Amp Current Transducer |
| 2000G-3F0-A | VAC - 15 PSI Pressure Transducer |
| 2000G-3F0-A | VAC - 15 PSI Pressure Transducer |
| 2000G-3F0-A | VAC - 15 PSI Pressure Transducer |
| 20000-6F0-A | VAC - 45 PSI Pressure Transducer |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |
| | Thermocouple |

TABLE 4-continued

Hot Room Test Station Transducers

| | |
|---|---|
| | Thermocouple |
| | Thermocouple |

TABLE 5

Parallel Test Station Transducers

| | |
|---|---|
| FTA-4567 | 0–500 Hz Frequency Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| VT7-003DX1047 | 0–50 Volt Transducer DC to 10 kHz |
| VT7-005DX1047 | 0–150 Volt Transducer DC to 10 kHz |
| VTR-002DX1358 | 0–300 Volt Transducer True RMS, 60 msec |
| CT7-015D | 0–10 Amp Current Transducer |
| CT7-015DX1047 | 0–10 Amp Current Transducer |
| CT7-017DX1047 | 0–20 Amp Current Transducer |

TABLE 6

Endurance Test Station Transducers

| | |
|---|---|
| FTA-4567 | 0–500 Hz Frequency Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-062DX1337 | Volt/Watt/Amp Transducer |
| PC20-002DX1337 | Volt/Watt/Amp Transducer |
| VT7-009D | 0–500 Volt Transducer DC to 10 kHz |
| VT7-009D | 0–500 Volt Transducer DC to 10 kHz |
| VT7-009D | 0–500 Volt Transducer DC to 10 kHz |
| VT7-012D | 0–800 Volt Transducer DC to 10 kHz |
| VT7-012D | 0–800 Volt Transducer DC to 10 kHz |
| VT7-012D | 0–800 Volt Transducer DC to 10 kHz |
| VTR-004DX1358 | 0–600 Volt Transducer True RMS |
| VTR-004DX1358 | 0–600 Volt Transducer True RMS |
| VTR-004DX1358 | 0–600 Volt Transducer True RMS |
| VT7-005DX1047 | 0–150 Volt Transducer DC to 10 kHz |
| VTR-002DX1358 | 0–300 Volt Transducer True RMS, 60 msec |
| CT7-015D | 0–10 Amp Current Transducer |
| CT7-015D | 0–10 Amp Current Transducer |
| CT7-015D | 0–10 Amp Current Transducer |
| CT7-015DX1047 | 0–10 Amp Current Transducer |
| 2000G-3F0-A | VAC - 15 PSI Pressure Transducer |
| 2000G-3F0-A | VAC - 15 PSI Pressure Transducer |
| 2000G-6F0-A | VAC - 45 PSI Pressure Transducer |

TABLE 7

Precheck Test Station Transducers

| | |
|---|---|
| FTA-4567 | 0–500 Hz Frequency Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |
| PC20-002DX1337 | Volt/Watt/Amp Transducer |

TABLE 7-continued

Precheck Test Station Transducers

| | |
|---|---|
| PC20-002DX1337 | Volt/Watt/Amp Transducer |
| PC20-002DX1337 | Volt/Watt/Amp Transducer |
| PC20-002DX1337 | Volt/Watt/Amp Transducer |
| VT7-005DX1047 | 0–150 Volt Transducer DC to 10 kHz |
| VTR-002DX1358 | 0–300 Volt Transducer True RMS, 60 msec |
| CT7-015DX1047 | 0–10 Amp Current Transducer |

In another embodiment of the present invention, a generator set testing system comprises four test stations of the same type. A technician can thereby conduct similar tests at the four test stations, and thus can conduct tests very efficiently.

A computer of a test station operates in accordance with testing software resident thereupon. The testing software includes a user interface (not shown) for interaction with a user (not shown). The user interface presents to the user in textual and graphical form on a computer monitor (not shown) a list of options from which the user selects a desired command. When the computer requires information from the user, for example, when the user must select a test to perform, the user interface presents to the user in textual and graphical form an explanation of an appropriate data entry method for the required information, such as proper keystrokes or graphical menu operations. The user interface further presents to the user in textual and graphical form an explanation of required user actions, such as how to configure a generator set in preparation for a test. When the user must respond to the computer, for example, to indicate that he has finished configuring the generator set in preparation for a test, the user responds to the user interface by computer input operations such as performing keystroke or mouse operations.

The testing software does not allow a user at a test station to view, modify or delete test parameters, such as generator set output characteristics to measure or pass/fail parameters. To allow a user at a test station to view, modify or delete test parameters violates the integrity of the testing process.

Figure 6:
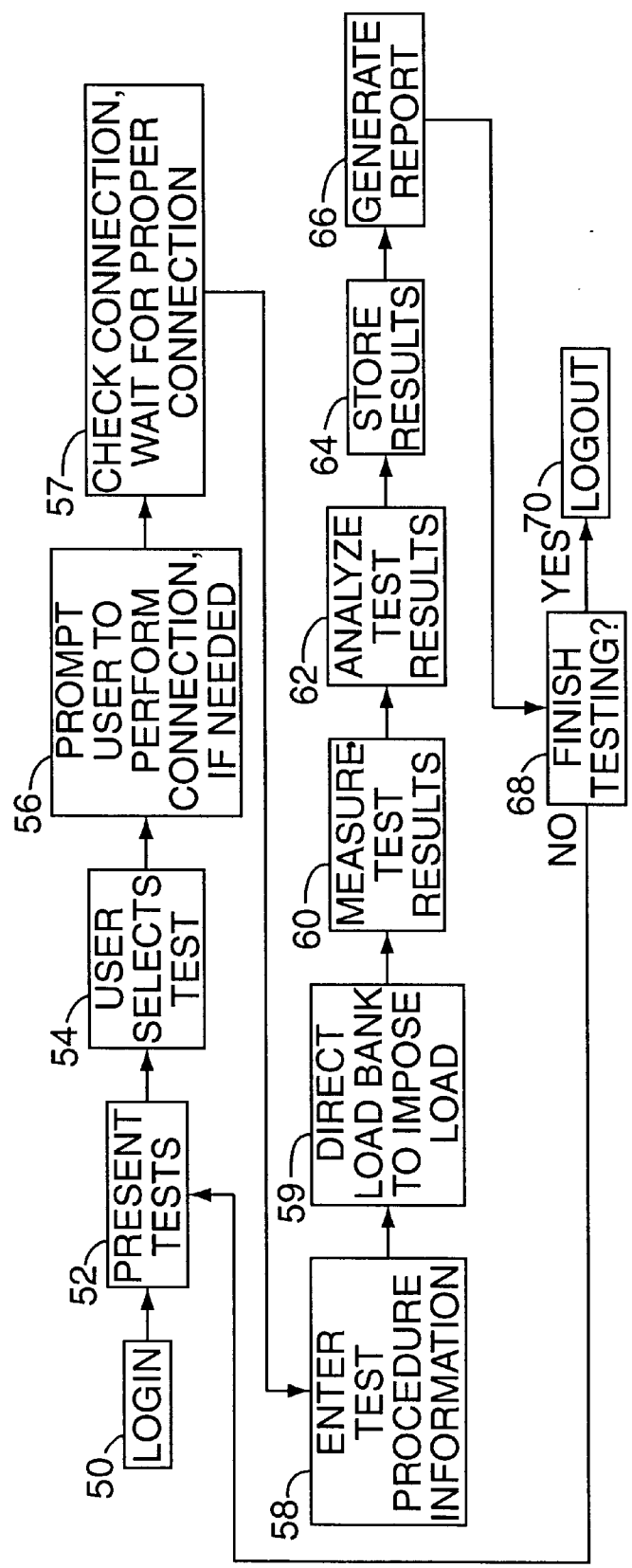
FIG. 6 is a flow chart which illustrates a process by which testing software directs the operations of an automated test station.

FIG. 6 is a flow chart which illustrates a process by which the testing software operates. The testing software does not allow a user to operate a test station computer until the user logs in by providing the testing software with a user name and user ID number, as shown by step 50. After logging in, the user operates the test station computer as described herein to test a generator set.

At the start of a test, the testing software presents to the user a list of available test procedures which are stored on the file server, as shown by step 52. The testing software determines an ordering in which to schedule the tests to perform on a given generator set. Some tests must be performed before others, for example, if certain tests are only to be performed if the generator set has passed another test. Certain tests may be performed simultaneously with one another. The testing software only presents test procedures which may be performed at that time. Since the testing software eliminates the need for the user to schedule tests, the user need not be a highly trained technician.

The user selects a desired test procedure through the user interface, as shown by step 54, and the computer, if necessary, prompts the user as to how to connect the generator set to the rest of the automated test station, such as the load bank and the signal conditioning box, as shown by step 56. The testing software schedules the tests such that tests which require the same generator set connections are performed substantially sequentially. Thus, the user does not frequently reconnect the generator set, minimizing user errors and maximizing generator set testing throughput.

The user connects the generator set as directed, and the computer assures that the proper connections have been made by attempting to send signals through the connections and receiving signals back if the proper connections exist, as shown by step 57. If the required connections are not properly made, the computer informs the user of the errors or omissions detected in the connections. Once the required corrections are established, the operator enters test procedure specified data into the computer as shown by step 58. Such data can include the generator set model and the generator set serial number.

The computer then starts a test. As shown by step 59, the computer directs the load bank to impose an electrical load upon the generator set in accordance with the test. The computer then measures the results of the test by recording the outputs of the generator set, as shown by step 60, and analyzes the results of the test, as shown by step 62. As tests are performed on a given generator set, a testing record for that generator set reflects which tests have been performed and which tests remain. For all tests, test results are presented to the file server for storage and presentation, as shown by step 64. The user name and user ID number are included in the test results, allowing test results to be associated with the user who operated the test station during the test.

As shown by step 66, the computer generates a report of the test results, preferably by generating a text file or printing a report on a printer. All test results are retained on the test station computer for a prescribed period of time after being presented to the file server, thus retaining on the network more than a single copy of the test results. If the network or file server fails, data is retained locally on the test station. As shown by steps 68 and 70, when the user finishes using the test station computer, he logs out, indicating to the computer that the user has stopped testing.

As described hereinabove, during a test an automated test unit receives from a generator set output signals which are indicative of output characteristics of the generator set. For example, if a test requires measurement of the output voltage of the generator set, then the automated test unit receives and processes a subset of the output signals which are indicative of the output voltage of the generator set. Accordingly, the generator set testing system provided in accordance with the present invention is capable of performing a variety of tests by imposing an appropriate load on the generator set and processing an appropriate set of output signals as described hereinabove.

One example of a test procedure which is implemented by the generator set testing system provided in accordance with the present invention is the performance of method 608.1b of MIL-STD-705C, "Frequency and Voltage Regulation, Stability and Transient Response test (Short Term)", hereinafter referred to as "method 608.1b". As described in MIL,-STD-705C, method 608.1b is a test procedure for measuring the frequency regulation of a generator set which is under a variety of load conditions, as well as for measuring the voltage regulation of a generator set which is under a variety of load conditions.

As discussed hereinabove, a generator set is coupled to an automated test unit so that the automated test unit receives output signals from the generator set. In this example, the output signals are indicative of a voltage and a frequency of the generator set. A signal conditioning box of the automated test unit receives the output signals. A voltage transducer of the signal conditioning box generates measurement signals in dependence upon a subset of the output signals which are indicative of the voltage of the generator set. The measurement signals generated by the voltage transducer are indicative of the voltage of the generator set. Furthermore, a frequency transducer of the signal conditioning box generates measurement signals in dependence upon a subset of the output signals which are indicative of the frequency of the generator set. The measurement signals generated by the frequency transducer are indicative of the frequency of the generator set.

A data acquisition board receives the measurement signals generated by the voltage transducer at a first channel input terminal and further receives the measurement signals generated by the frequency transducer at a second channel input terminal. The data acquisition board generates, in dependence upon the measurement signals received from the voltage transducer, processing signals at a first channel output terminal which are indicative of the voltage of the generator set. Furthermore, the data acquisition board generates, in dependence upon the measurement signals received from the frequency transducer, processing signals at a second channel output terminal which are indicative of the frequency of the generator set.

The processing signals from the data acquisition board are received by a computer. The processing signals, which are indicative of method 608.1b test results, specifically generator set voltage and frequency, are analyzed by the computer in accordance with testing software. The testing software, in this example, directs the computer to analyze the processing signals in accordance with method 608.1b. Method 608.1b specifies that the responses of the frequency and voltage of the generator set under a variety of load conditions are to be measured. Voltage stability denotes the tendency of the generator set voltage to remain substantially at a constant value. Typically, the voltage does not remain constant, but slightly deviates from a mean voltage value. Similarly, frequency stability denotes the tendency of the generator set frequency to remain substantially at a constant value. Typically, the frequency does not remain constant, but slightly deviates from a mean frequency value.

In measuring the frequency stability and voltage stability of a generator set, the computer analyzes the generally time-varying value of the frequency and voltage to determine parameters specified by method 608.1b, such as a time at which the voltage enters a steady state band, or range, a time at which the frequency enters a steady state range, an amount by which the frequency overshoots a steady state range, and an amount by which the voltage overshoots a steady state range. Additional parameters which are specified by method 608.1b are disclosed by MIL-STD-705C. The parameters specified by method 608.1b are calculated from the processing signals by the computer in accordance with testing software. Those skilled in the art will be able to derive the parameters from the processing signals in a manner consistent with the way MIL-STD-705C specifies that parameters are derived from generator set voltage and frequency.

Further in accordance with method 608.1b, the generator set testing system provided in accordance with the present invention is able to automatically perform tasks which require substantial expertise of an individual in conventional systems. One such task is to detect the existence of an out-of-specification condition of the generator set known as a "hunting condition". A hunting condition is generally symptomatic of a failure in a generator set's control system.

Figure 9:
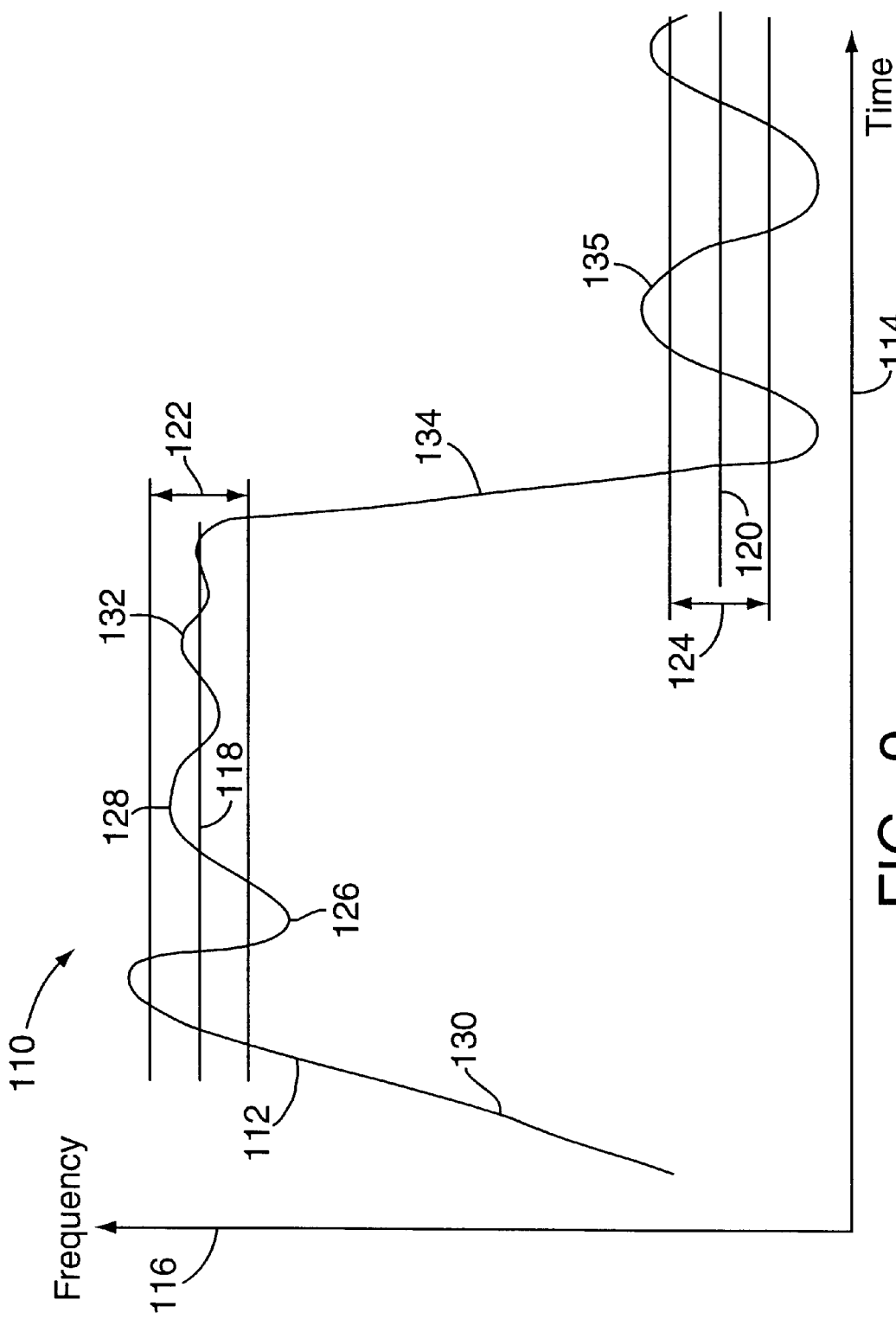
FIG. 9 is a graph of an output signal of a generator set over time.

A hunting condition occurs when an output signal of the generator set, such as voltage or frequency, does not stabilize to a substantially constant mean value, but instead periodically varies above and below a constant mean value by more than a prescribed amount. FIG. 9 shows a graph 110 of generator set frequency plotted versus time. Frequency is represented by a Y-axis 116 and time is represented by a X-axis 114. A curve 112 of the graph 110 indicates the frequency of the generator set at given times. A first mean of the frequency is denoted by reference numeral 118, and a desirable frequency range 122 indicates an acceptable range of frequencies about the first mean 118. A second mean of the frequency is denoted by reference numeral 120, and a desirable frequency range 124 indicates an acceptable range of frequencies about the second mean 120.

FIG. 9 further illustrates frequency stabilization, as well as a hunting condition in the frequency. A portion 130 of the curve 112 indicates a transition period during which the frequency is increasing, such as after a load imposed on the generator set changes from a first load to a second load. While the frequency increases during this transition period, the frequency is initially outside of the desirable frequency range 122. A point 126 indicates a time during which the frequency is outside of the desirable frequency range 122, and therefore the frequency has not yet stabilized. A point 128 indicates a time during which the frequency is within the desirable frequency range 122. A portion 132 of the curve 112, which represents a period subsequent to the time represented by the point 128, remains within the desirable frequency range 122, thus indicating a stabilized frequency.

A portion 134 of the curve 112 indicates a transition period during which the frequency is decreasing, such as after the load imposed on the generator set changes from a second load to a third load. While the frequency decreases during this transition period, the frequency is initially outside of the desirable frequency range 124. A portion 135 of the curve 112, which represents a period subsequent to the portion 134, periodically varies outside of the desirable frequency range 124. Since the frequency during this period does not remain within the desirable frequency range 124, the frequency during this period does not stabilize, and a hunting condition exists.

Detection of a hunting condition with conventional generator set testing systems typically requires human experience and intuition. It is especially difficult to determine whether or not the output signal of the generator set, such as voltage or frequency, exhibits a hunting condition, or has simply not yet stabilized. If there is no hunting condition, then when a load imposed upon a generator set is changed to a new load, the output signal of the generator set increases or decreases, depending on the new load, and stabilizes to a range of values substantially identical to a constant mean value. Upper and lower bounds of the range are generally unknown. It is therefore difficult to determine when the output signal of the generator set has stabilized to within the range. The maximum or minimum values of the output signal after the load change cannot alone be used to determine the existence of a hunting condition, since the range is unknown.

Figure 10:
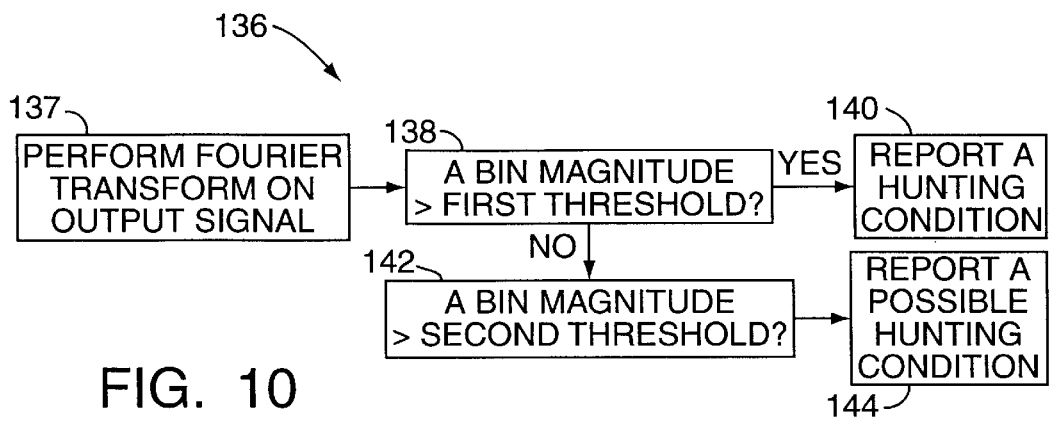
FIG. 10 is a flow chart which illustrates a process by which an automated test station determines the existence of a hunting condition in a generator set.

FIG. 10 depicts a flow chart which illustrates a process 136 by which the generator set testing system provided in accordance with the present invention detects a hunting condition in an output signal, for example the output signal which is indicative of generator set frequency or voltage. A test station computer performs the process 136 for each load imposed on the generator set during a test, also known as a "load step". As shown by step 137, the testing software directs the computer to perform a discrete Fourier transform on the output signal associated with a load step. As is known in the art, a Fourier transform is a process which generates a set of "bins", wherein each bin is indicative of a magnitude of a "frequency component" of an input signal. For example, in a discrete Fourier transform which generates three bins, each bin has a magnitude which indicates the magnitude of a one of three frequency component.

The computer performs a discrete Fourier transform which generates bins indicative of magnitudes of frequency components for a prescribed range of frequencies. In the preferred embodiment, the computer generates bins for every 0.1 Hz between 0.49 Hz and 49 Hz, though another number of bins and another range of frequencies may be used without departing from the scope of the present invention. Each of the bins has a magnitude which is compared with a first bin threshold, as shown by step 138. If there is at least one bin which has a magnitude greater than the first bin threshold, then a hunting condition exists for the associated load step, and the computer reports to the user that a hunting condition exists, as shown by step 140. If there are no bins which have a magnitude greater than the first bin threshold, then each of the magnitudes of the bins is compared with a second bin threshold, as shown by step 142. If there is at least one bin which has a magnitude greater than the second bin threshold, then a possible hunting condition exists for the associated load step. As shown by step 144, if a possible hunting condition exists then the computer reports to the user that a possible hunting condition exists and further reports which bins have magnitudes that exceed the second bin threshold. The existence of a possible hunting condition requires an individual, such as a test administrator or a quality assurance specialist, to analyze the output signal and determine whether a hunting condition actually exists.

In the preferred embodiment, the first bin threshold is 1.0 and the second bin threshold is 0.1. The values of the first bin threshold and the second bin threshold are test parameters. Accordingly, the first bin threshold and second bin threshold values are controlled by an authorized user of the file server control software resident on the file server, as described hereinabove.

Figure 11:
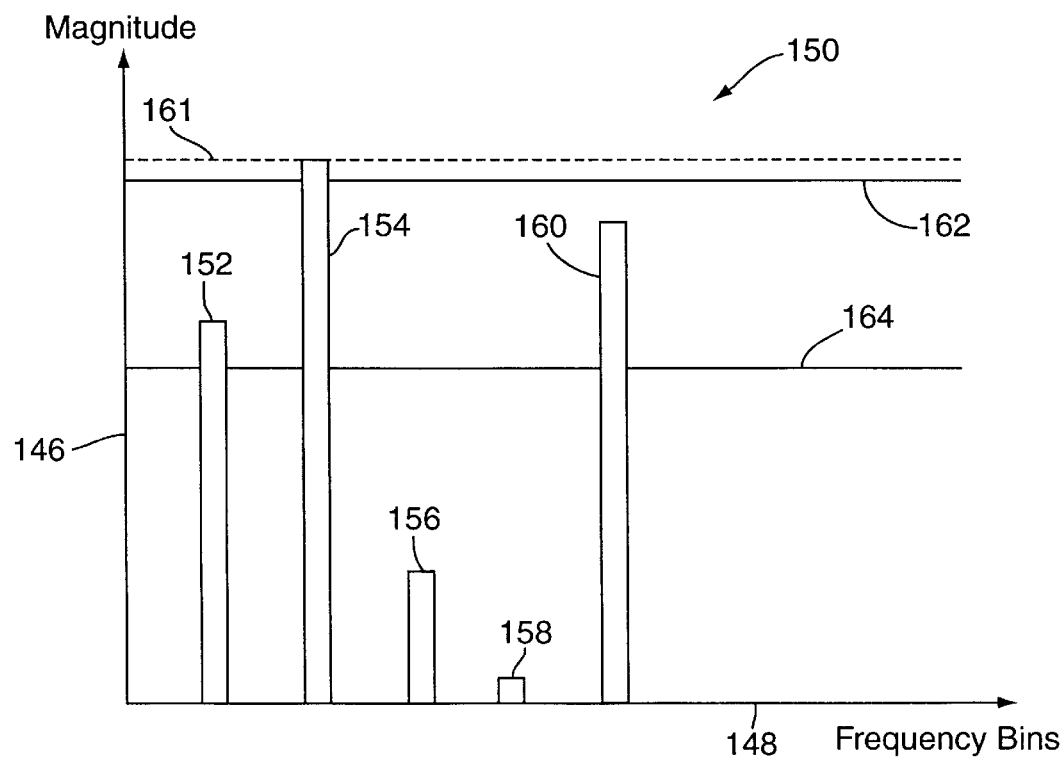
FIG. 11 is a chart which illustrates a use of bins in detecting a hunting condition.

FIG. 11 shows a chart 150 having bins 152, 154, 156, 158 and 160 which are indicative of magnitudes of frequency components of an input signal, as described hereinabove. Magnitude is represented by a Y-axis 146, and frequencies of the bins 152, 154, 156, 158 and 160 are represented by an X-axis 148. A first bin threshold 162 and a second bin threshold 164 define criteria for determining an existence of a hunting condition and of a possible hunting condition if no hunting condition exists. Since the bin 154 has a magnitude 161 which is greater than the first bin threshold 162, a hunting condition exists.

Although the invention has been shown and described with respect to a preferred embodiment thereof, it would be understood by those skilled in the art that other various changes omissions and additions thereto may be made without departing from the spirit and scope of the present invention. For example, the generator set testing system provided in accordance with the present invention may be modified to conduct different tests than those enumerated herein. Testing software can be modified to conduct different tests without modifying hardware components such as a signals conditioning box or a load bank control package. Similarly, by adding different transducers than those enumerated herein, the generator set testing system provided in accordance with the present invention can receive and process a wide range of output signals from a generator set, allowing a wider range of tests to be conducted by the system.

What is claimed is:

1. An apparatus for conducting an automated test on a generator set in accordance with prescribed test criteria, and further for automatically analyzing a result of the test in accordance with prescribed analysis criteria, the generator set having generator set output signals indicative of generator set output characteristics, the apparatus comprising:

an automated load bank coupled to the generator set for imposing upon the generator set an electrical load which is dependent upon load bank control signals; and automated testing means comprising:

a load bank control package coupled to said automated load bank for generating said load bank control signals in dependence on load bank command signals, output measurement means coupled to said generator set for receiving the generator set output signals and further for generating processing signals which are indicative of the generator set output signals, and a controller coupled to said load bank control package and to said output measurement means, said controller for receiving said processing signals and for generating test result signals indicative of the result of the test in dependence on said processing signals and in accordance with the prescribed analysis criteria, and further for generating said load bank command signals in accordance with the prescribed test criteria.

2. The apparatus of claim 1 wherein said output measurement means substantially simultaneously receives output signals indicative of a first generator set output characteristic and output signals indicative of a second generator set output characteristic, and further substantially simultaneously generates a first set of processing signals indicative of said first generator set output characteristic and a second set of processing signals indicative of said second generator set output characteristic.

3. The apparatus of claim 2 wherein said first generator set output characteristic is generator set voltage and said second generator set output characteristic is generator set frequency.

4. The apparatus of claim 1 further comprising:

a file server for providing to said automated testing means signals indicative of the prescribed test criteria and signals indicative of the prescribed analysis criteria, and further for receiving from said automated testing means said test result signals, and further for storing said test result signals.

5. The apparatus of claim 1 wherein said automated load bank comprises:

load bank means comprising a load element which is selectable between a first state and a second state, wherein said load bank imposes a first electrical load when said load element is in a first state, and imposes a second electrical load when said load element is in a second state, and load bank control means comprising a load bank control switch circuit for selecting said load element state in dependence on said load bank control signals.

6. The apparatus of claim 5 wherein said load bank control package comprises a plurality of output channels, wherein each output channel of said plurality of output channels generates a prescribed subset of said load bank control signals in dependence upon a prescribed subset of said load bank command signals, and wherein said load bank control switch circuit selects said load element state in dependence on a prescribed subset of said load bank control signals which are generated by an output channel of said plurality of output channels.

7. The apparatus of claim 1 wherein said output measurement means comprises:

signal conditioning means coupled to said generator set for receiving said output signals from said generator set, and further for generating measurement signals indicative of said output signals, said signal conditioning means comprising a plurality of transducer means, wherein each transducer means of said plurality of transducer means receives a prescribed subset of said output signals indicative of a prescribed generator set output characteristic and generates a prescribed subset of said measurement signals indicative of said prescribed generator set output characteristic; and data acquisition means coupled to said signal conditioning means for receiving said measurement signals from said signal conditioning means, and further for generating said processing signals in dependence thereupon.

8. The apparatus of claim 7 wherein said data acquisition means comprises a plurality of channels, wherein each channel of said plurality of channels receives a prescribed subset of said measurement signals and generates a prescribed subset of said processing signals.

9. An apparatus for conducting a plurality of automated tests on a plurality of generator sets in accordance with prescribed test criteria, and further for automatically analyzing results of said tests in accordance with prescribed analysis criteria, each said generator set of the plurality of generator sets having generator set output signals indicative of generator set output characteristics, said apparatus comprising:

a plurality of automated test stations, each automated test station of said plurality of automated test stations comprising:
an automated load bank coupled to a generator set of the plurality of generator sets for imposing upon the generator set an electrical load which is dependent upon load bank control signals;
a load bank control package coupled to said automated load bank for generating said load bank control signals in dependence on load bank command signals,
output measurement means coupled to said generator set for receiving the generator set output signals and further for generating processing signals which are indicative of the generator set output signals, and
a controller coupled to said load bank control package and to said output measurement means, said controller for receiving said processing signals and for generating test result signals indicative of the result of the test in dependence on said processing signals and in accordance with the prescribed analysis criteria, and further for generating said load bank command signals in accordance with the prescribed test criteria; and a file server coupled to said plurality of automated test stations for providing signals indicative of the prescribed test criteria and signals indicative of the prescribed analysis criteria to each of said plurality of automated test stations, and further for receiving from said plurality of automated test stations said test result signals and for storing said test result signals.

10. The apparatus of claim 9 wherein each of said plurality of automated test stations conducts a different one of the plurality of tests on the plurality of generator sets.

11. An automated testing apparatus for conducting an automated test on a generator set in accordance with prescribed test criteria, and further for automatically analyzing a result of the test in accordance with prescribed analysis criteria, the generator set having generator set output signals indicative of generator set output characteristics, the generator set coupled to an automated load bank which imposes upon the generator set an electrical load which is dependent upon received load bank control signals, the apparatus comprising:

a load bank control package coupled to the automated load bank for generating said load bank control signals in dependence on load bank command signals, output measurement means coupled to said generator set for receiving the generator set output signals and further for generating processing signals which are indicative of the generator set output signals, and a controller coupled to said load bank control package and to said output measurement means, said controller for receiving said processing signals and for generating test result signals indicative of the result of the test in dependence on said processing signals and in accordance with the prescribed analysis criteria, and further for generating said load bank command signals in accordance with the prescribed test criteria.

12. The apparatus of claim 11 wherein said output measurement means comprises:

signal conditioning means coupled to said generator set for receiving said output signals from said generator set, and further for generating measurement signals indicative of said output signals, said signal conditioning means comprising a plurality of transducer means, wherein each transducer means of said plurality of transducer means receives a prescribed subset of said output signals and generates a prescribed subset of said measurement signals indicative of said prescribed generator set output characteristic; and data acquisition means coupled to said signal conditioning means for receiving said measurement signals from said signal conditioning means, and further for generating said processing signals in dependence thereupon.

13. The apparatus of claim 12 wherein said data acquisition means comprises a plurality of channels, wherein each channel of said plurality of channels receives a prescribed subset of said measurement signals and generates a prescribed subset of said processing signals.

14. A method for conducting an automated test on a generator set in accordance with prescribed test criteria, and further for automatically analyzing a result of the test in accordance with prescribed analysis criteria, the generator set having generator set output signals indicative of generator set output characteristics, the method comprising the steps of:

imposing upon the generator set an electrical load in accordance with the prescribed test criteria;

generating processing signals which are indicative of the generator set output signals; and generating test result signals indicative of results of the test in dependence on said processing signals and in accordance with the prescribed analysis criteria.

15. The method of claim 14, wherein said step of generating processing signals comprises the steps of:

substantially simultaneously receiving output signals indicative of a first generator set output characteristic and output signals indicative of a second generator set output characteristic; and substantially simultaneously generating a first set of processing signals indicative of said first generator set output characteristic and a second set of processing signals indicative of said second generator set output characteristic.

16. The method of claim 14, further comprising the steps of:

receiving from a file server signals indicative of the prescribed test criteria and signals indicative of the prescribed analysis criteria;

presenting said file server with said test result signals; and storing said test result signals on said file server.

* * * * *